(12) United States Patent
Brobston et al.

(10) Patent No.: US 8,000,274 B2
(45) Date of Patent: Aug. 16, 2011

(54) VERSATILE SYSTEM FOR TRANSCEIVER NOISE REDUCTION IN A TIME-DIVISION DUPLEXING WIRELESS NETWORK

(75) Inventors: Michael L. Brobston, Allen, TX (US); Breck W. Lovinggood, Garland, TX (US); Robert W. Monroe, Melissa, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 1667 days.

(21) Appl. No.: 11/284,466

(22) Filed: Nov. 22, 2005

(65) Prior Publication Data

US 2006/0221874 A1    Oct. 5, 2006

(51) Int. Cl.
*H04B 3/20*    (2006.01)
(52) U.S. Cl. ........ 370/288; 370/278; 370/280; 370/287
(58) Field of Classification Search ................... 370/280, 370/278, 287, 288, 294
See application file for complete search history.

(56) References Cited

U.S. PATENT DOCUMENTS

| | | | | |
|---|---|---|---|---|
| 3,639,840 A * | 2/1972 | Shekel et al. | ................ | 725/151 |
| 4,160,248 A * | 7/1979 | Hubka et al. | ................ | 342/115 |
| 4,991,165 A * | 2/1991 | Cronyn | ................ | 370/278 |
| 5,060,293 A * | 10/1991 | Kok et al. | ................ | 455/78 |
| 5,408,205 A * | 4/1995 | Blacka | ................ | 333/81 R |
| 5,410,729 A * | 4/1995 | Kumagai et al. | ................ | 455/12.1 |
| 5,428,831 A * | 6/1995 | Monzello et al. | ................ | 455/296 |
| 5,521,561 A * | 5/1996 | Yrjola et al. | ................ | 333/103 |
| 5,564,087 A * | 10/1996 | Cygan et al. | ................ | 455/126 |
| 5,911,116 A * | 6/1999 | Nosswitz | ................ | 455/83 |
| 6,125,138 A * | 9/2000 | Kumagai | ................ | 375/219 |
| 6,356,536 B1 * | 3/2002 | Repke | ................ | 370/282 |
| 6,434,368 B1 * | 8/2002 | Stadmark | ................ | 455/83 |
| 6,591,086 B1 * | 7/2003 | Pleasant | ................ | 455/78 |
| 6,717,981 B1 * | 4/2004 | Mohindra | ................ | 375/219 |
| 6,972,610 B2 * | 12/2005 | Behzad | ................ | 327/359 |
| 7,065,327 B1 * | 6/2006 | Macnally et al. | ................ | 455/78 |
| 7,248,625 B2 * | 7/2007 | Chien | ................ | 375/219 |
| 7,412,217 B2 * | 8/2008 | Boos | ................ | 455/129 |
| 7,428,230 B2 * | 9/2008 | Park | ................ | 370/345 |
| 7,482,852 B1 * | 1/2009 | Samavati | ................ | 327/359 |
| 2007/0014257 A1 * | 1/2007 | Strong | ................ | 370/328 |
| 2007/0184790 A1 * | 8/2007 | Gilberton et al. | ................ | 455/127.1 |

FOREIGN PATENT DOCUMENTS

WO    WO0152426    *    7/2001

* cited by examiner

*Primary Examiner* — Ricky Ngo
*Assistant Examiner* — Dewanda Samuel

(57) ABSTRACT

A system for suppressing transmission channel noise in a signal transmission/reception device—particularly a time division duplex (TDD) wireless communications device—is provided. The system provides one or more shunt elements, instantiated at some point along the device's signal transmission channel. One or more attenuation elements are also instantiated at some point along the signal transmission channel, as are one or more disabling elements. A trigger signal indicates when the device is shifting from signal transmission operation (or mode) to signal reception operation. Responsive to assertion of the trigger signal, the shunt, attenuation and disabling elements are activated.

20 Claims, 5 Drawing Sheets

VERSATILE SYSTEM FOR TRANSCEIVER NOISE REDUCTION IN A TIME-DIVISION DUPLEXING WIRELESS NETWORK

TECHNICAL FIELD OF THE INVENTION

The present application relates generally to the fields of circuit design and wireless telecommunication technologies, and more particularly, to a versatile system for attenuating transceiver noise in a time division duplexing wireless network.

BACKGROUND OF THE INVENTION

Increasing demand for more powerful and convenient data and information communication has spawned a number of advancements in communications technologies. One area of particular interest is broadband communication, and related applications. The growing usage of broadband communications has given rise to a number of manufacturing and operational considerations. Some of those considerations are unique to broadband, while others are common to most communications technologies. Amongst the common considerations for most modern communications technologies is the need or desire to maximize data transfer rates.

An emerging trend in broadband communications—especially among technologies such as wireless broadband (WiBro) and TD-SCDMA (Time Division Synchronous Code Division Multiple Access)—is the inclusion of time division duplexing (TDD) operation in systems having relatively high power operations.

Generally, TDD uses a single channel for full duplex communications. Separation between transmit and receive occurs in the time domain on the same carrier frequency. Transmission direction alternates between uplink (i.e., transmit) and downlink (i.e., receive), and the amount of bandwidth allocated to each direction is flexible. A carrier can use any part of the channel to its full capacity in either the forward or reverse direction in response to demand.

TDD-based wireless base-stations and equipment frequently employ a single antenna architecture, utilizing some form of time duplexer module to alternately route the transmitter and receiver to an antenna. Commonly, time duplexer modules take the form of a T/R (transmit/receive) or transceiver switch module—one that simply rapidly switches the antenna connection alternately between transmit and receive channels.

Conventionally, T/R switches have some finite isolation between transmit and receive paths. As such, noise from the transmit channel—especially from components intended to boost transmission signal power (e.g., power amplifier)—may still leak into the receive channel during receive mode, desensitizing or otherwise degrading receiver performance. This is especially problematic for receiver components designed for low-noise operation.

In a number of conventional TDD applications, designers often made a tradeoff between increasing isolation—which was costly from a design and operational overhead perspective—and accepting a certain level of transmission channel noise during receive operation. Such a tradeoff was acceptable in many conventional TDD applications, since the magnitude of the transmission channel noise was relatively small due to relatively low overall system power levels.

With the advent and growth of higher power TDD-based systems, however, the deleterious effects of transmission channel noise during receive operation can no longer be adequately addressed with such conventional tradeoffs. Higher transmission power requirements require greater amplification along the transmission channel—increasing the capacity for and magnitude of noise experienced during receive operation. Greatly increasing isolation circuitry between the transmit and receive channels is costly, and therefore not a practical solution for many cost-sensitive consumer product applications—especially wireless communications systems.

As a result, there is a need for a system that addresses and minimizes the deleterious effects of transmission channel noise during the receive mode of a transceiver component in a high power TDD wireless communications system—in a manner that complements any existing component isolation without requiring increased switch isolation circuitry—providing efficient and reliable communications in an easy, cost-effective manner.

SUMMARY OF THE INVENTION

A versatile system, comprising various apparatus and methods, is provided for minimizing transmission channel noise effects on receive operation of a transceiver component in a high power TDD wireless communications system. The system of the present disclosure suppresses transmission channel noise without relying on increased switch isolation circuitry. This system is readily and easily adaptable to a number of device applications, design requirements, and production or manufacturing processes—efficiently and cost-effectively addressing high-power TDD transceiver applications.

Specifically, this system provides a series of attenuation elements implemented within a transmission channel portion of a TDD transceiver. Attenuation, shunting and disabling constructs are deployed at critical points along a component's transmission signal path—removing or negating sources of noise during receive operation.

More specifically, a system for suppressing transmission channel noise in a signal transmission/reception device—particularly a time division duplex (TDD) wireless communications device—is provided. The system provides one or more shunt constructs, instantiated at some point along the device's signal transmission channel. One or more attenuation constructs are also instantiated at some point along the signal transmission channel, as are one or more disabling constructs. A trigger signal indicates when the device is shifting from signal transmission operation (or mode) to signal reception operation. Responsive to assertion of the trigger signal, the shunt, attenuation and disabling constructs are activated.

In other embodiments, a system for improving signal reception in a wireless communications system—especially one that has a time division duplex (TDD) transceiver device operating therein, is provided. A plurality of attenuation elements are instantiated along a signal transmission path of the TDD device, and maintained in a passive state during signal transmissions. A trigger signal, indicative of a shift by the TDD device from signal transmission to signal reception, is provided. The attenuation elements are then activated responsive to assertion of the trigger signal.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged TDD switching structure, or any other transceiver switching structure in which transmission channel noise suppression during receive operation is desired.

The following disclosure provides a versatile system, comprising various apparatus and methods, for minimizing transmission channel noise effects during receive operation of a time division duplexing (TDD) transceiver component. This system is especially useful in high power TDD wireless applications, where effects of transmission channel noise can greatly compromise receive operations. The system of the present disclosure suppresses transmission channel noise without relying on increased switch isolation circuitry. This system is readily and easily adaptable to a number of device applications, design requirements, and production or manufacturing processes.

Specifically, this system provides a series of elements—collectively referred to as "attenuation elements"—that are instantiated or utilized within a transmission channel portion of a TDD transceiver switch component. The attenuation elements comprise various attenuation, shunting, and disabling constructs, deployed at critical points along a component's transmission signal path to remove or negate noise sources during receive operation.

Figure 1:
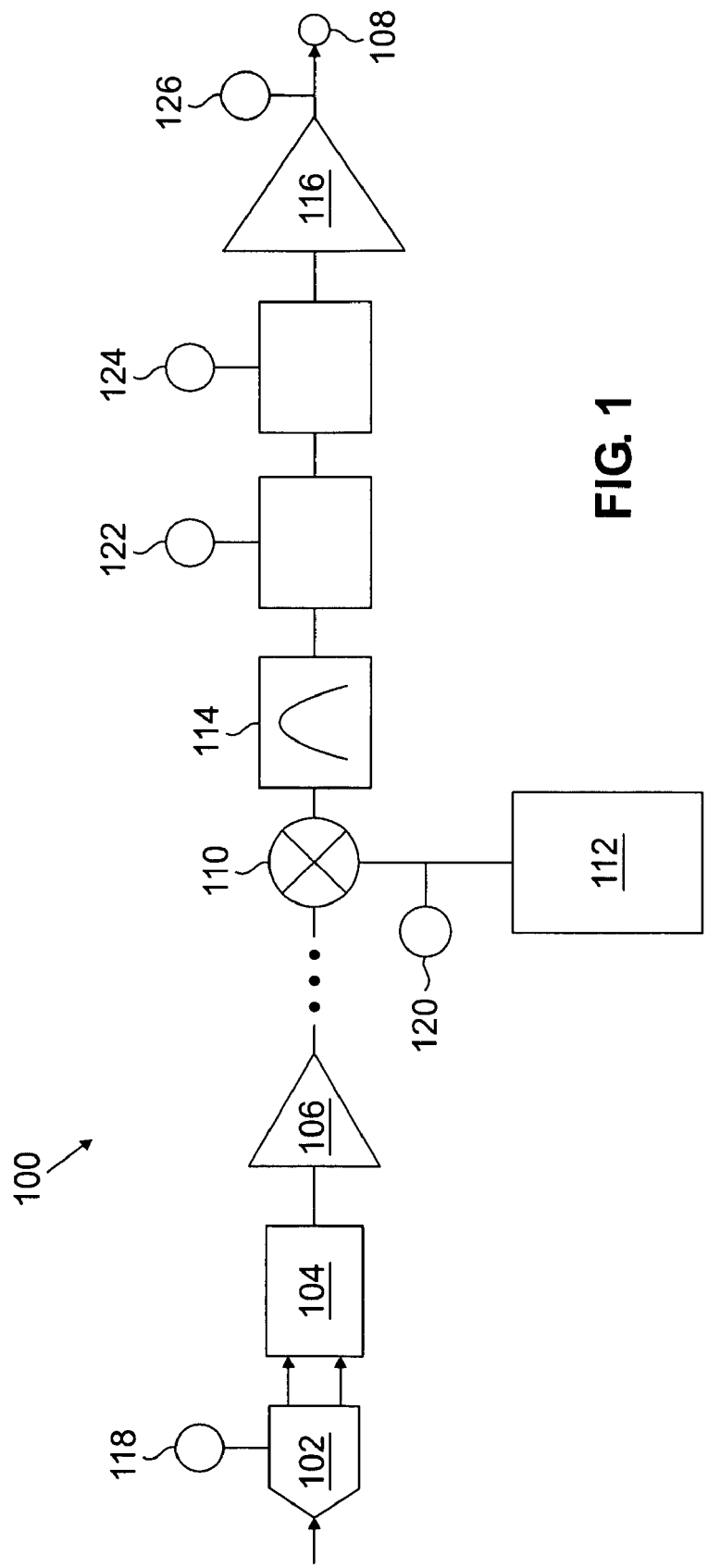
FIG. 1 illustrates an embodiment of a transmission channel segment in accordance with the present disclosure.
Figure 2:
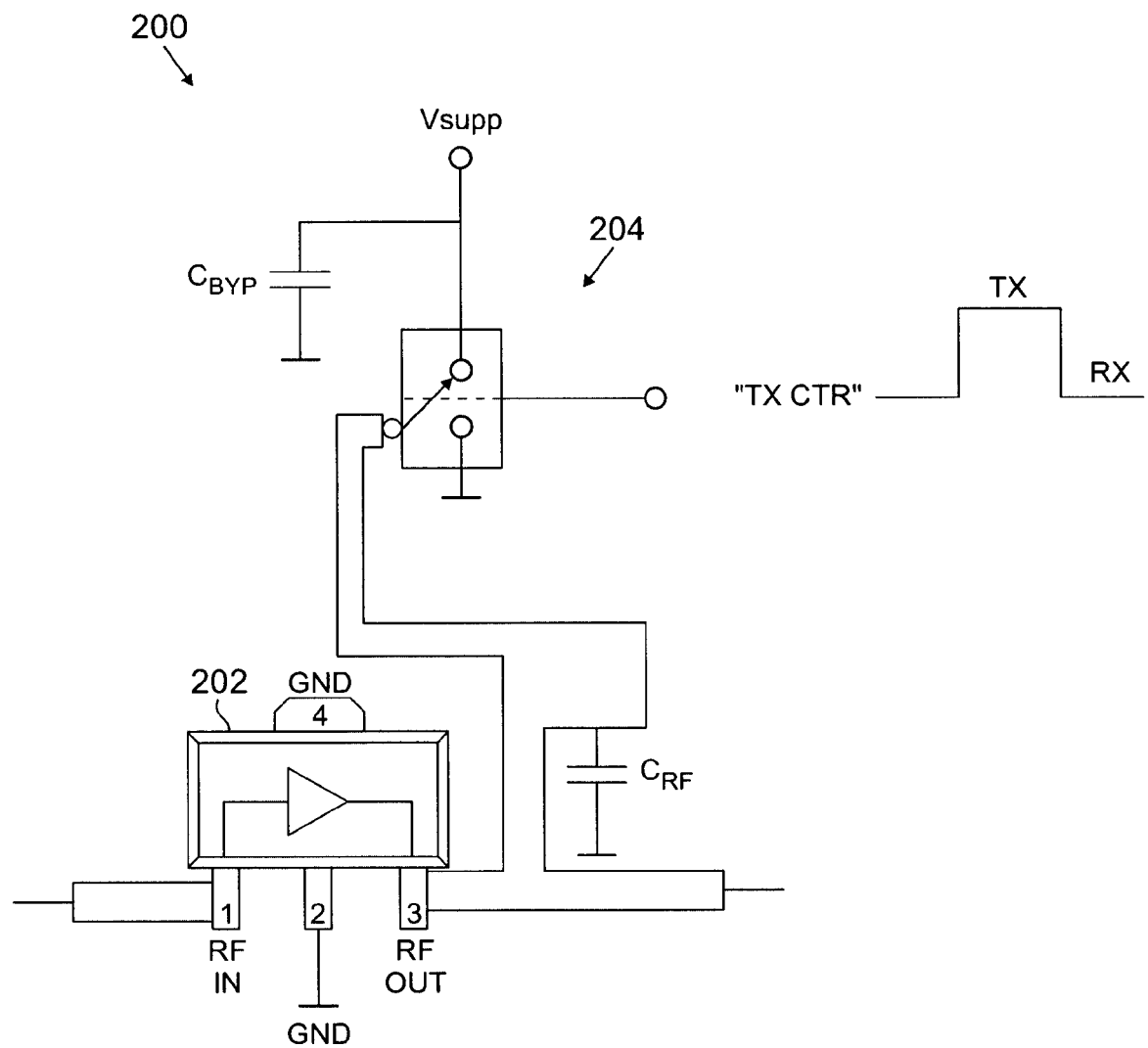
FIG. 2 illustrates one embodiment of an attenuation element in accordance with the present disclosure.

Certain aspects and embodiments of the present system are described now in greater detail with reference to FIG. 1, which depicts one representative embodiment of a transmission channel segment 100. Transmitter segment 100 depicts certain operational components and devices, including attenuation elements, of a TDD transmission channel according to the present disclosure. Segment 100 comprises a digital-to-analog converter (DAC) 102, a transformer element 104, and initial amplification element 106. As indicated by the directional arrows, signals generally flow into segment 100 through the conversion component 102 and, after appropriate conditioning or processing, out through node 108 for transmission through switch and antenna circuitry or components (not shown).

Segment 100 further comprises a modulation or mixing element 110, which is driven by a local oscillation element 112. Element 110 outputs a conditioned signal that passes through filter 114 for eventual amplification by amplification element 116 and transmission out through node 108.

Without the benefit of the system of the present disclosure, various components and portions of segment 100 contribute to a substantial cumulative noise effect at node 108. For example, considerable transmitter noise is present at DAC 102, and phase noise and spurious products are present at oscillation element 112. These noise sources can combine and become amplified through the IF and RF gain stages of the transmitter, until the noise at node 108 exceeds the intended receiver signals entering the antenna. When such transmitter noise exits node 108, it leaks through the finite isolation of the T/R switch, and into the receiver—creating a finite degradation in receive signal quality.

In accordance with the present disclosure, however, segment 100 comprises attenuation elements 118, 120, 122, 124 and 126 at various points in the transmission channel. Each attenuation element may be instantiated at a point in segment 100 where it negates or obviates a noise factor or source that might otherwise contribute to the previously mentioned cumulative noise at node 108.

Attenuation elements 118-126 may comprise a variety of physical or operational constructs, or various combinations thereof. For example, an attenuation element may comprise additional circuitry implementing a switch. In other embodiments, an attenuation element may comprise the performance of a certain operation on already existing circuitry. In still many other embodiments, each attenuation element may comprise the performance of a certain operation on existing or new circuitry, or some combination thereof.

In segment 100, each attenuation element 118-126 operates responsive to some trigger signal that signifies a shift from transmit operation to receive operation. In such a way, the attenuation elements can be readily implemented within existing transmission channel circuitry and components without impacting transmission performance. For the embodiment illustrated by segment 100, the trigger signal for all attenuation elements may be a transmit control (TX CTR) signal, originating from a system element outside of segment 100.

The first attenuation element 118 comprises disabling transmission DAC 102 during receive operation. Depending upon the specific design and operation of DAC 102, element 118 may be implemented in a number of ways. Certain DAC devices have a transmit enable pin that can quickly enable or disable DAC outputs. For such designs using such DACs, element 118 may be implemented by de-asserting the DAC transmit enable pin when receive operation begins, using the trigger signal. This effectively shuts off DAC 102, eliminating noise originating at or before that point. Other DAC devices may be effectively disabled by, for example, loading all zeros—or some other suitable null data set—to the DAC upon transition to receive mode, as signaled by the trigger signal. This may be accomplished by pre-loading an FPGA, or any other suitable logic or circuit construct, that outputs a fixed value to the DAC input upon transition to receive mode. The fixed value may be either a zero-scale or mid-scale value.

A second attenuation element 120 may be instantiated between mixing element 110 and local oscillation (LO) element 112, to effectively shut down mixing element 110 during receive operations. Element 120 comprises a construct that deprives modulator/mixer 110 of any signal from LO 112 by disabling the LO buffer, located between LO 112 and mixer 110.

A LO buffer is typically provided in the form of a low power amplifier-one that may be quickly disabled by applying a drain pulsing method (described hereinafter) to the drain. This is briefly illustrated in reference now to FIG. 2, which depicts one embodiment of an LO buffer segment 200 according to the present disclosure. Segment 200 comprises an LO buffer 202, in the form of a MMIC (monolithic microwave integrated circuit) amplifier. Segment 200 also comprises an attenuation component 204 that is responsive to a transition in the trigger signal. During transmit bursts, as indicated by the trigger signal, component 204 enables drain current flow and effectively turns on the LO for system 100. When the trigger signal indicates receive mode, drain current flow is disabled, effectively shutting the LO off. This effectively suppresses noise from two sources. Noise from the LO is suppressed by muting the LO buffer. With no LO drive, this in turn places the mixer into a high attenuation state which suppresses noise from 102, 104 and 106.

Figure 3:
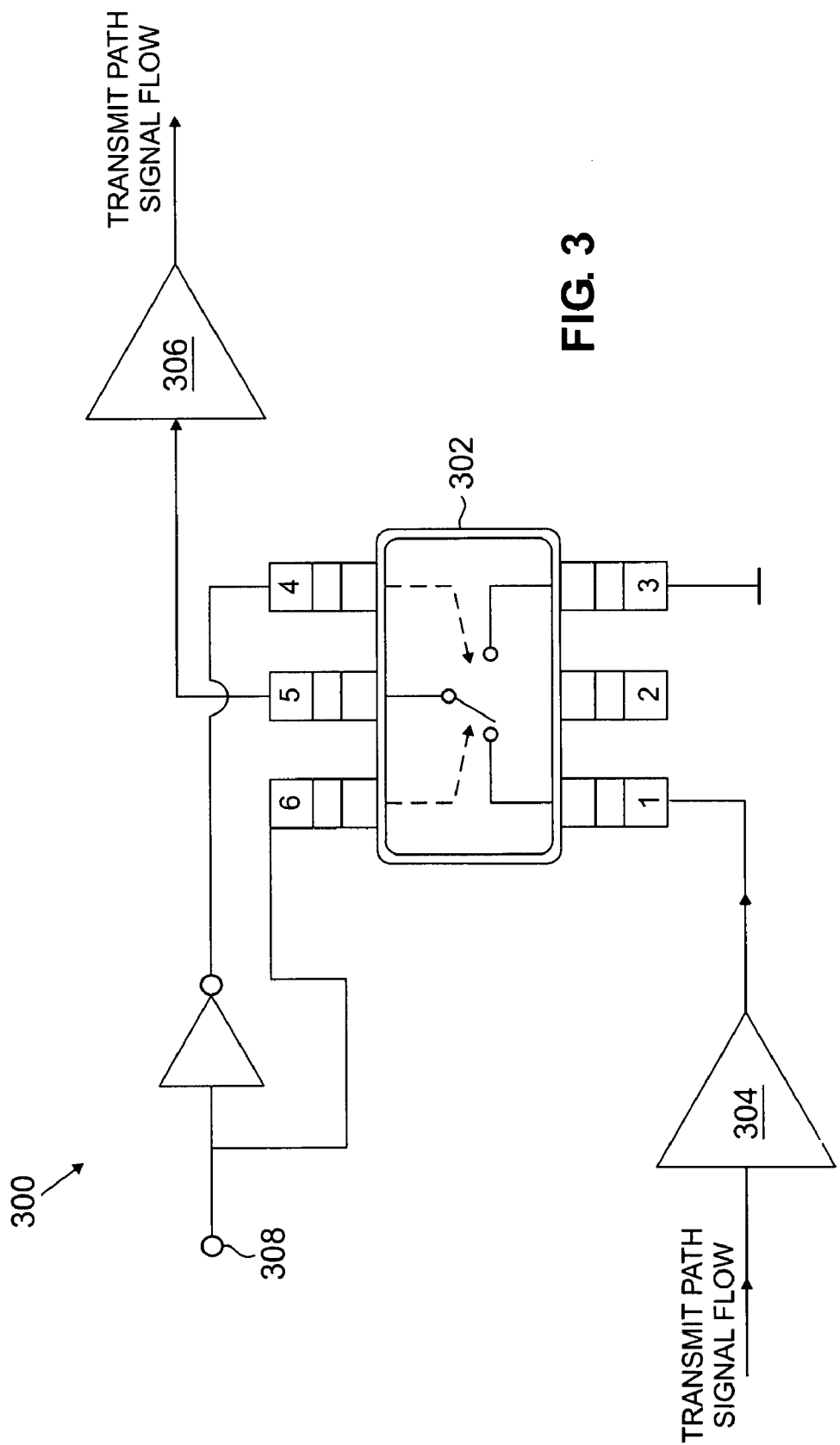
FIG. 3 illustrates another embodiment of an attenuation element in accordance with the present disclosure.

Referring back now to FIG. 1, a third attenuation element 122 may be instantiated in the signal path after element 110. Attenuation element 122 provides a signal path shunt during receive operations—presenting subsequent amplifiers in segment 100 with a reduced noise level, thereby decreasing the overall transmitter noise. This is briefly illustrated in FIG. 3, which depicts one embodiment of a signal path shunt 300 according to the present disclosure. Shunt element 300 comprises a low loss series switch 302, disposed in series with the signal path between two transmitter elements 304 and 306. As depicted in FIG. 3, switch 302 is in transmit mode position, conducting signal traffic between elements 304 and 306. Responsive to the trigger signal, as received at input 308, switch 302 shifts to a second position during receive operation, where it shunts element 306 to ground, and effectively attenuates transmitter noise by a value equal to isolation present in switch 302.

Again referring to FIG. 1, another attenuation element 124 may also be instantiated in the signal path after element 110, prior to final amplification. Attenuation element 118 provides a maximized signal attenuator component during receive operation. In a number of embodiments, segment 100 may already comprise some incumbent attenuator device. In such embodiments, element 118 comprises a construct to rapidly shift such a component from some nominal value to maximum attenuation during a receive mode burst. In other embodiments, where an incumbent attenuator device is not accessible, element 118 comprises a construct having an attenuation device configured to rapidly shift such a component from some nominal value to maximum attenuation during a receive mode burst. The particular attenuation device may be digital or analog, and provided in accordance with the requirements of the particular design.

Figure 4:
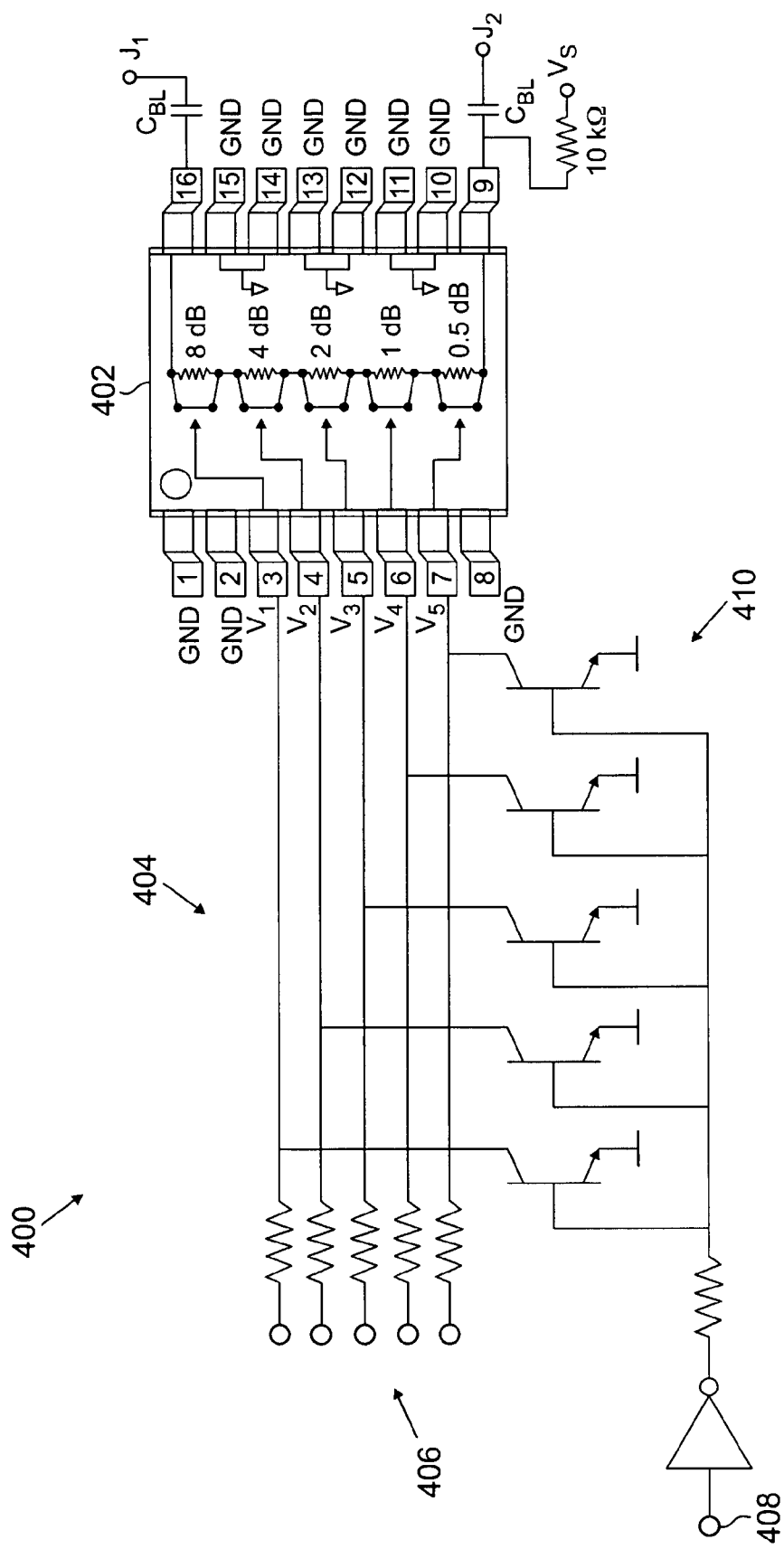
FIG. 4 illustrates another embodiment of an attenuation element in accordance with the present disclosure.

One embodiment of such an attenuation construct 400 is briefly described now in reference to FIG. 4. Construct 400 comprises an attenuation device 402 coupled to a shifting element 404. Device 402 may comprise any suitable attenuator that operates in accordance with this disclosure. Device 402 has some nominal attenuation value (e.g., 0.5 dB) that is adjustable to some maximum value (e.g., 15.5 dB). Element 404 is coupled to control or selection inputs of device 402 such that it may selectively change attenuation value. Element 404 is responsive to the trigger signal at input 408 such that when in transmit mode, element 404 is off and appears as a high impedance to control signals 406, such that it does not disturb the attenuator settings during transmit mode. Once receive mode is initiated, as indicated by the trigger signal, element 404 is activated and overrides inputs 406 to shift device 402 to a maximum or desired attenuation value—thereby reducing the noise by the maximum attenuation value (e.g., 15.5 dB). In the embodiment depicted, inputs 406 may comprise a series of user-adjustable voltage sources. Element 404 further comprises a series of switching transistors 410, each coupled to a respective input 406 and operable to shut the input off during transmit mode. Other suitable attenuation and switching circuitry may be similarly employed.

Referring to FIG. 1, a fifth attenuation element 126 may be instantiated in the signal path prior to node 108. Depending upon the nature and requirements of the other constituent elements of segment 100, element 126 may be instantiated at some intermediate amplification stage or at a final amplification stage, or in multiple locations. Attenuation element 126 provides a gate pulsing construct—operable upon any transistor structure (e.g., LDMOS, GaAs, GaN) in such an amplification stage—that quickly ramps the FET's gate voltage up or down to enable or disable the device. Disabled during receive operation, the FET stage exhibits a very high level of attenuation to noise.

Figure 5:
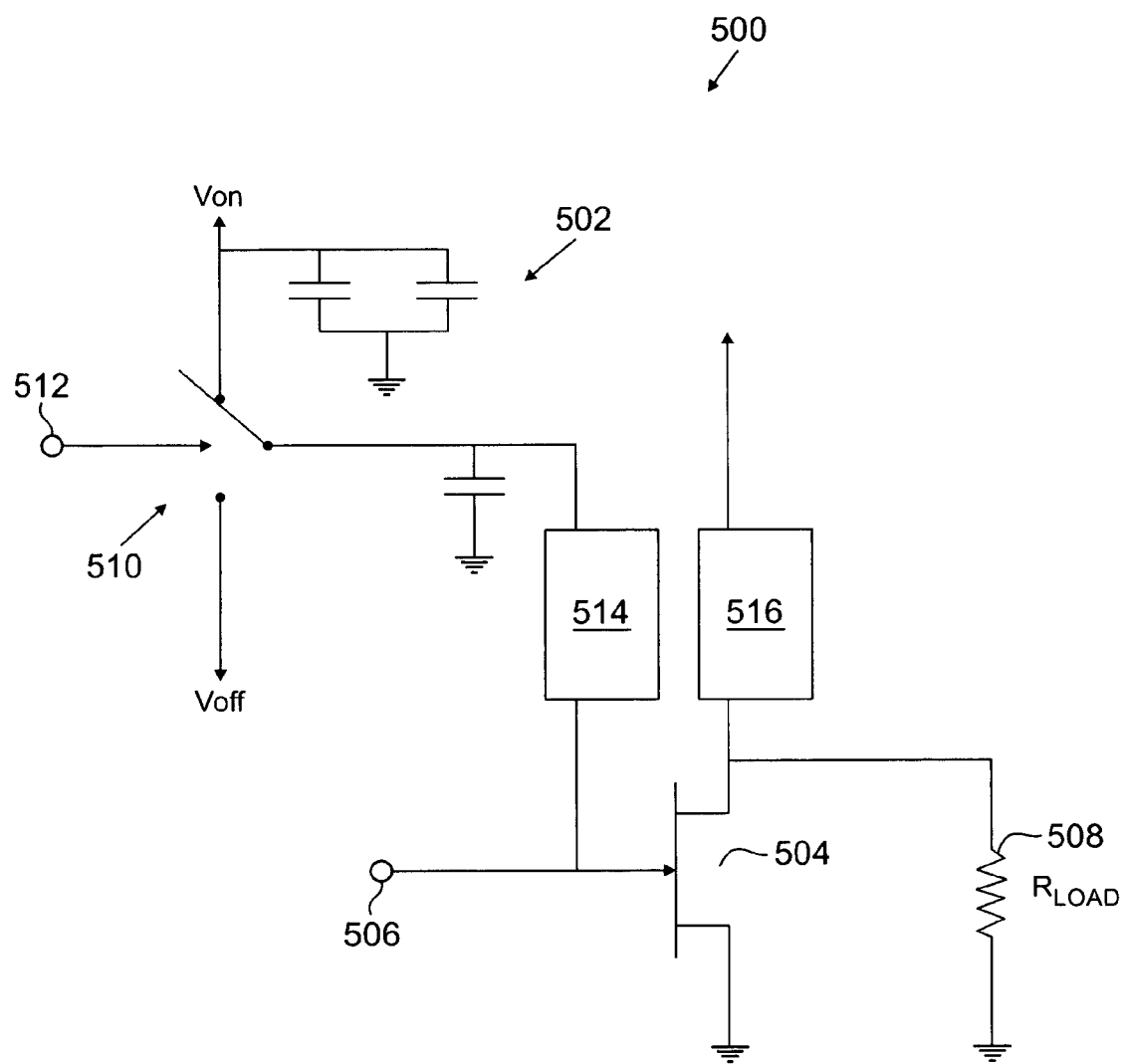
FIG. 5 illustrates an embodiment of an attenuation element in accordance with the present disclosure.

An embodiment is illustrated in reference now to FIG. 5, which depicts a FET stage 500 comprising a gate pulsing construct 502. During transmit operation, a FET 504 has its gate coupled to transmitter signal 506 as the drain drives a load 508. Construct 502 is coupled to the gate of transistor 504. Construct 502 comprises a switching element 510, operating responsive to the trigger signal as received at input 512. During transmit operation, element 510 switches to couple to source circuitry that brings the gate of transistor 504 up to its proper active level. Once the trigger signal indicates a shift to receive operation, element 510 switches to effectively couple the gate of transistor 504 to some off-state voltage level ($V_{off}$) (e.g., ground for LDMOS, $-V_{off}$ for GaAs or GaN). This, in turn, shuts transistor 504 off and causes a strong attenuation of any noise sourced either from prior circuitry or generated within the amplifier circuit. Construct 502 may further comprise a matching or reference component 514 (e.g., a gate feed circuit) for applying static or pulsed gate voltage while preventing RF from disturbing gate bias circuitry, and also a drain feed circuit 516 for supplying drain current to the FET while suppressing RF from entering and disturbing the drain bias circuitry.

Thus, by the system of the present disclosure one or more attenuation elements may be provided with or in relation to a transmission signal path to systematically remove various noise contributions. Such attenuation elements may take the form of shunting constructs, actual attenuators, or disabling constructs, deployed at critical points a component's transmission signal path. These attenuation elements are provided such that they remain passive or inoperable during transmission operations, and active only once a device or component has shifted to receiving operations. The present system may be implemented in addition to or in conjunction with incumbent isolation or suppression components.

It should now be easily appreciated by one of skill in the art that the system of the present disclosure provides and comprehends a wide array of variations and combinations easily adapted to a number of switching applications. The various constructs, elements and operations disclosed herein may be provided in any manner suitable for a particular application. For example, a particular construct may comprise a separate integrated circuit chip, or may be implemented as a macro within some larger chip, or implemented using discrete components. The shunting scenarios and attenuation values may be varied greatly, or substituted or combined, to provide a particular operational configuration. All such variations and modifications are hereby comprehended.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A transceiver device having a signal transmission path comprising:
    a digital signal input;
    a digital to analog converter coupled to the digital signal input;
    signal conditioning circuitry coupled to the digital to analog converter and comprising a mixing element driven by a local oscillator;
    signal amplification circuitry coupled to the signal conditioning circuitry;
    signal transmission components coupled to the signal amplification circuitry; and
    a plurality of noise attenuation elements instantiated between the digital signal input and the signal transmission components, a first of the plurality of noise attenuation elements comprising a construct adapted to disable an output of the digital to analog converter during signal reception, a second of the plurality of noise attenuation elements comprising a construct adapted to disable a local oscillator buffer between the local oscillator and the mixing element.

2. The device of claim 1, wherein the device is a high power time division duplex transceiver device.

3. The device of claim 1, wherein the construct adapted to disable the digital to analog converter comprises deactivation of a transmit enable pin.

4. The device of claim 1, wherein the construct adapted to disable the digital to analog converter comprises loading of a null data set into the digital to analog converter.

5. The device of claim 1, wherein the local oscillator buffer comprises a MMIC (monolithic microwave integrated circuit) amplifier.

6. The device of claim 1, wherein a third of the plurality of noise attenuation elements comprises a shunt element, disposed among the signal amplification circuitry, and adapted to shunt the signal transmission path to ground during signal reception.

7. The device of claim 1, wherein a fourth of the plurality of noise attenuation elements comprises a signal attenuator, disposed among the signal amplification circuitry, and adapted to provide attenuation at a nominal level during signal transmission and at a maximum level during signal reception.

8. The device of claim 1, wherein a fifth of the plurality of noise attenuation elements comprises a gate pulsing construct, coupled to the signal amplification circuitry, and adapted to enable an amplification output stage during signal transmission and disable the amplification output stage during signal reception.

9. A transceiver device having a signal transmission path comprising:
    a digital signal input;
    a digital to analog converter coupled to the digital signal input;
    a mixing element coupled to the digital to analog converter, the mixing element driven by a local oscillator;
    signal amplification circuitry coupled to the mixing element;
    signal transmission components coupled to the signal amplification circuitry; and
    a plurality of noise attenuation elements instantiated between the digital signal input and the signal transmission components, a first of the plurality of noise attenuation elements comprising a construct configured to disable an output of the digital to analog converter during signal reception, a second of the plurality of noise attenuation elements comprising a construct adapted to disable a local oscillator buffer between the local oscillator and the mixing element.

10. The device of claim 9, wherein the construct configured to disable the digital to analog converter comprises deactivation of a transmit enable pin.

11. The device of claim 9, wherein the construct configured to disable the digital to analog converter comprises loading of a null data set into the digital to analog converter.

12. The device of claim 10, wherein the local oscillator buffer comprises a MMIC (monolithic microwave integrated circuit) amplifier.

13. The device of claim 12, wherein a third of the plurality of noise attenuation elements comprises a shunt element, disposed among the signal amplification circuitry, and configured to shunt the signal transmission path to ground during signal reception.

14. The device of claim 13, wherein a fourth of the plurality of noise attenuation elements comprises a signal attenuator, disposed among the signal amplification circuitry, and configured to provide attenuation at a nominal level during signal transmission and at a maximum level during signal reception.

15. The device of claim 14, wherein a fifth of the plurality of noise attenuation elements comprises a gate pulsing construct, coupled to the signal amplification circuitry, and configured to enable an amplification output stage during signal transmission and disable the amplification output stage during signal reception.

16. For use in a wireless communications network, a time division duplex (TDD) transceiver device, comprising:
    a receive signal path; and
    a transmission signal path, the transmission signal path comprising:
        a digital signal input;
        a digital to analog converter coupled to the digital signal input;
        signal conditioning circuitry coupled to the digital to analog converter and comprising a mixing element driven by a local oscillator;
        signal amplification circuitry coupled to the signal conditioning circuitry;
        signal transmission components coupled to the signal amplification circuitry; and
        a plurality of noise attenuation elements instantiated between the digital signal input and the signal transmission components, a first of the plurality of noise attenuation elements comprising a construct adapted to disable an output of the digital to analog converter during signal reception, a second of the plurality of noise attenuation elements comprising a construct adapted to disable a local oscillator buffer between the local oscillator and the mixing element.

17. The device of claim 16, wherein the signal conditioning circuitry comprises a mixing element driven by a local oscillator.

18. The device of claim 17, wherein a third of the plurality of noise attenuation elements comprises a shunt element, disposed among the signal amplification circuitry, and adapted to shunt the signal transmission path to ground during signal reception.

19. The device of claim 18, wherein a fourth of the plurality of noise attenuation elements comprises a signal attenuator, disposed among the signal amplification circuitry, and adapted to provide attenuation at a nominal level during signal transmission and at a maximum level during signal reception.

20. The device of claim 19, wherein a fifth of the plurality of noise attenuation elements comprises a gate pulsing construct, coupled to the signal amplification circuitry, and adapted to enable an amplification output stage during signal transmission and disable the amplification output stage during signal reception.

* * * * *